United States Patent
Singh et al.

(10) Patent No.: US 6,465,156 B1
(45) Date of Patent: Oct. 15, 2002

(54) METHOD FOR MITIGATING FORMATION OF SILICON GRASS

(75) Inventors: Bhanwar Singh, Morgan Hill, CA (US); Bharath Rangarajan, Santa Clara, CA (US); Steven Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/422,390

(22) Filed: Oct. 21, 1999

(51) Int. Cl.$^7$ ............................. G03F 7/38; G03P 7/00
(52) U.S. Cl. ............... 430/313; 430/314; 430/315; 430/317; 430/318; 430/322; 430/329; 216/38; 216/87
(58) Field of Search ............................. 430/313, 314, 430/315, 317, 318, 322, 329; 216/38, 87

(56) References Cited

U.S. PATENT DOCUMENTS

| | | | |
|---|---|---|---|
| 4,978,594 A | 12/1990 | Bruce et al. | 430/14 |
| 5,259,888 A * | 11/1993 | McCoy et al. | 134/2 |
| 5,312,717 A | 5/1994 | Sachdev et al. | 430/313 |
| 5,525,192 A * | 6/1996 | Lee et al. | 156/651.1 |
| 6,277,015 B1 * | 8/2001 | Robinson et al. | 451/582 |

* cited by examiner

*Primary Examiner*—Janet Baxter
*Assistant Examiner*—Amanda C. Walke
(74) *Attorney, Agent, or Firm*—Amin & Turocy, LLP

(57) ABSTRACT

The present invention relates to a method for mitigating formation of silicon grass. A silylation process is performed on a semiconductor structure, the structure including a photoresist layer, an underlayer under the photoresist layer, and a substrate under the underlayer. A chemical mechanical polishing process is employed to remove a portion of the photoresist layer.

17 Claims, 5 Drawing Sheets

US 6,465,156 B1

METHOD FOR MITIGATING FORMATION OF SILICON GRASS

TECHNICAL FIELD

The present invention generally relates to a method for mitigating formation of silicon grass.

BACKGROUND OF THE INVENTION

In the semiconductor industry, there is a continuing trend toward higher device densities. Fabrication of very large scale integrated circuits (VLSI) and ultra large scale integrated circuits (ULSI) requires that resist materials, lithographic processes, and exposure tools meet necessary performance demands for high throughput manufacturing of sub-micron feature size devices. In the instance of submicron lithography, top surface imaging (TSI) is employed to increase resolution capability of optical exposure systems. Several TSI processes have been developed such as Diffusion Enhanced Silylated Resist (DESIRE) negative tone process and positive tone Silylated Acid Hardened Resist (SAHR).

Top surface imaging in general uses reactive ion etching (RIE) to dry develop patterns after exposure and silylation of a photoresist layer. A dry development process for top surface imaging requires high selectivity between exposed and unexposed regions of the photoresist to maintain critical dimensions, high anisotropy to provide vertical profiles in the patterned photoresist and also result in no residue after etching.

A significant problem with TSI resist processes is that RIE residue, in the form of "grass", is produced. RIE grass is a problem in both positive and negative working systems, since residue free images are desired. The grass is produced as a result of silicon being incorporated into regions to be etched, such that micromasks are formed in those regions, thus preventing the desired regions from being completely etched during etching, resulting in the "grass"-like residue. Such residues are undesirable—for example, they may interfere with substrate metal and/or metal-to-metal contacts in subsequent metallization steps resulting in multitude of problems including contact resistance and metal adhesion.

Prior Art FIGS. 1a–1e describe a conventional silylation process on a structure 10 which results in the formation of grass. In FIG. 1a, a substrate 16 has a metal layer 18 formed thereon, and a photoresist layer 20 lies over the metal layer 18. The photoresist layer 20 is patterned and exposed to silicon containing vapor 24 as shown in FIG. 1b. The exposed areas 26 of the photoresist layer 20 in FIG. 1c have silicon formed thereon which will be subsequently (after being converted to $SiO_2$) used as an etch mask during a metal layer etch. However, unexposed areas 28 of the photoresist layer 20 have trace amounts of silicon thereon. In FIG. 1d, the structure 10 undergoes an $O_2$ plasma etch 40 to etch away desired portions of the photoresist layer. However, spikes 44 of photoresist can result (corresponding to the trace amounts of silicon residues on the photoresist layer 20) as shown in FIG. 1e. The spikes 44 will create problems in the subsequent metal layer etch.

In view of the above, it would be desirable for a method to eliminate or mitigate the formation of silicon "grass" residue formed from a silylation process.

SUMMARY OF THE INVENTION

The present invention provides for a method which mitigates formation of silicon grass. A silylation process is performed to render a portion of a photoresist mask $O_2$ resistant by treatment with an organo-silicon reagent in solution or in vapor phase after resist patterning. A chemical mechanical polishing (CMP) process is performed to remove any trace amounts of silicon that may have formed on unexposed areas of the photoresist layer as a result of the silylation process. After the CMP process is complete, the photoresist layer is plasma etched and then employed as an etch mask for the underlying layer (e.g., polysilicon layer, metal layer, silicon nitride layer, or oxide layer). The removal of trace amounts of silicon from the photoresist layer via the CMP process mitigates the formation of silicon grass. One aspect of the invention relates to a method for mitigating formation of silicon grass. A silylation process is performed on a semiconductor structure, the structure including a photoresist layer, an underlayer under the photoresist layer, and a substrate under the underlayer. A chemical mechanical polishing process is employed to remove a portion of the photoresist layer.

Another aspect of the invention relates to a method for mitigating formation of silicon grass. A silylation process is performed on a semiconductor structure, the structure including a photoresist layer, an underlayer under the photoresist layer, and a substrate under the underlayer. A chemical mechanical polishing process is employed to remove a portion of the photoresist layer. A reactive ion etch is performed to remove select portions of the photoresist layer, and an underlayer etch is performed to remove select portions of the underlayer.

Yet another aspect of the present invention relates to a method for mitigating formation of silicon grass. A silylation process is performed on a semiconductor structure, the structure including a photoresist layer having portions including trace amounts of silicon; and a chemical mechanical polishing process is performed to remove the trace amounts of silicon.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
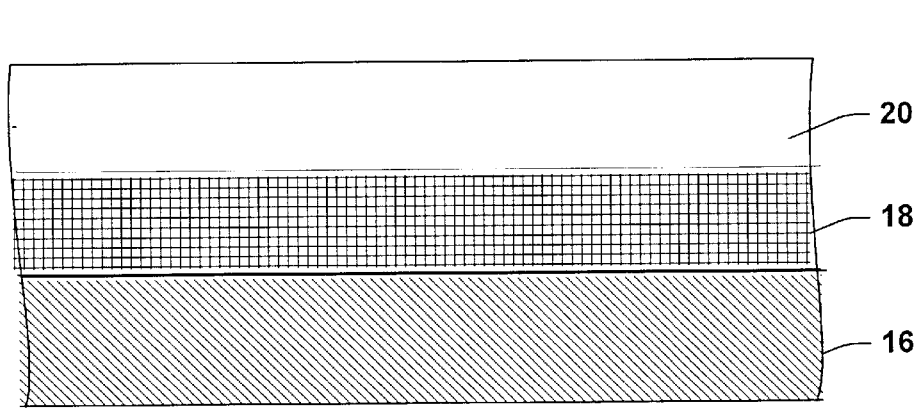
FIG. 1a is a schematic cross-sectional illustration of a structure including a substrate, a metal layer and a photoresist layer.
Figure 1B:
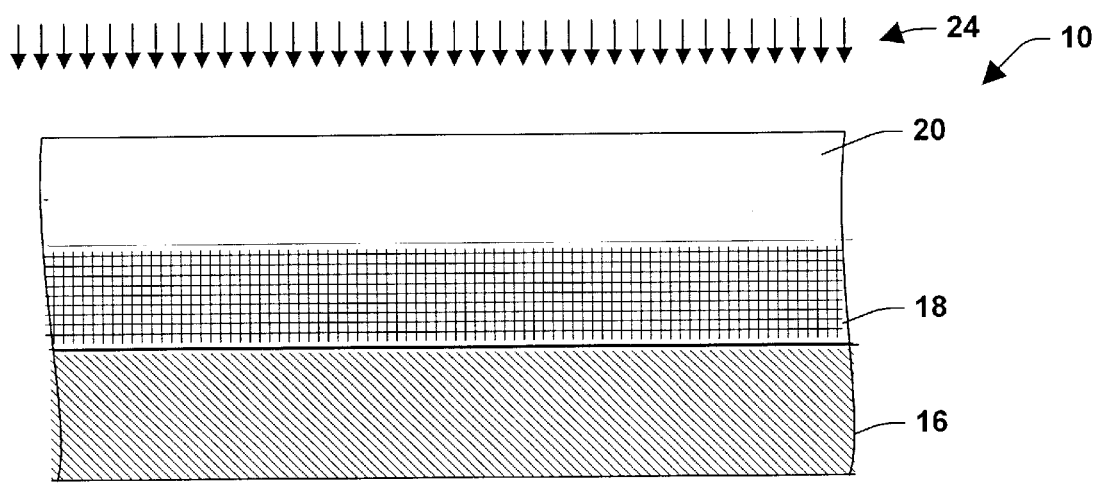
FIG. 1b is a schematic cross-sectional illustration of the structure of FIG. 1a of the photoresist layer being patterned and undergoing a silylation process.
Figure 1C:
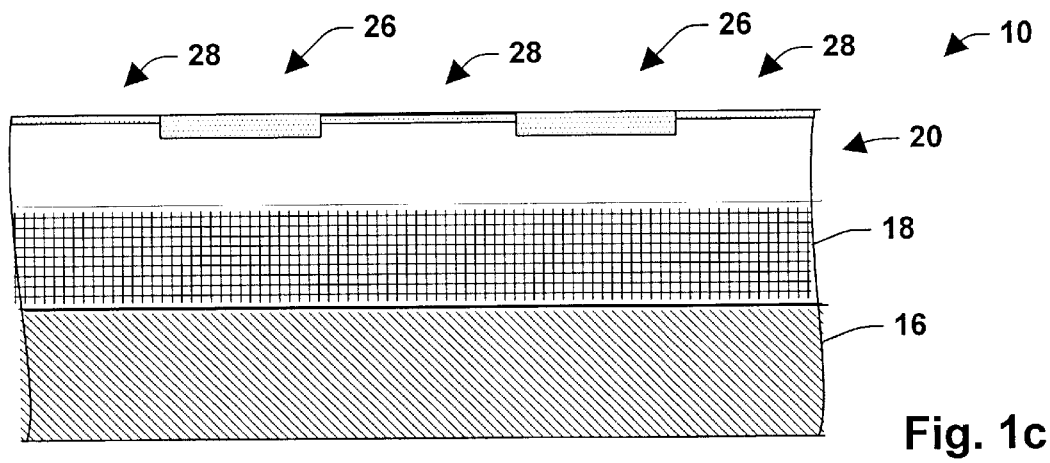
FIG. 1c is a schematic cross-sectional illustration of the structure of FIG. 1b after the silylation process is substantially complete.
Figure 1D:
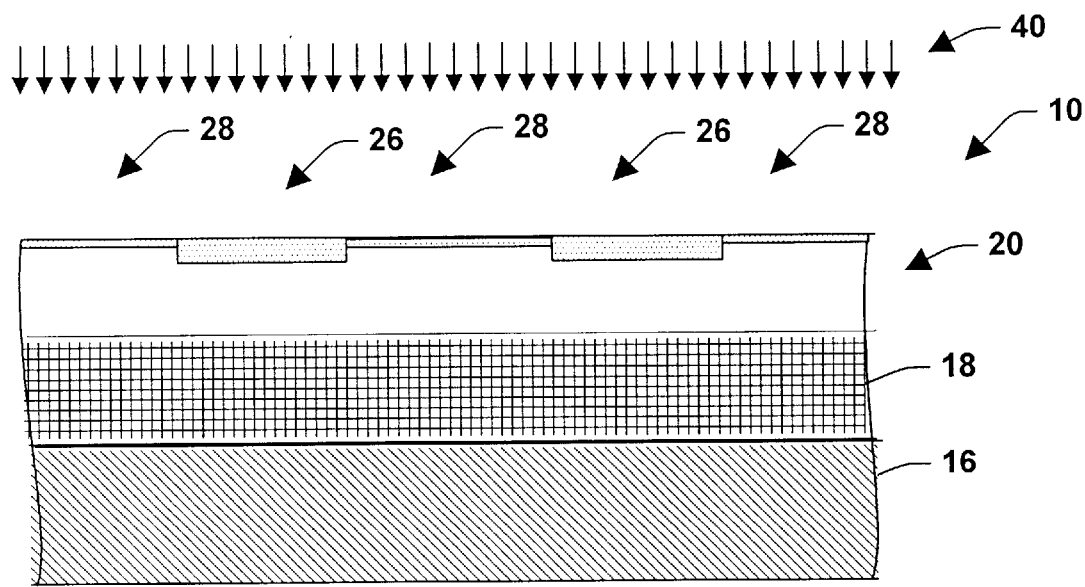
FIG. 1d is a schematic cross-sectional illustration of the structure of FIG. 1c undergoing an $O_2$ reactive ion etch (RIE).
Figure 1E:
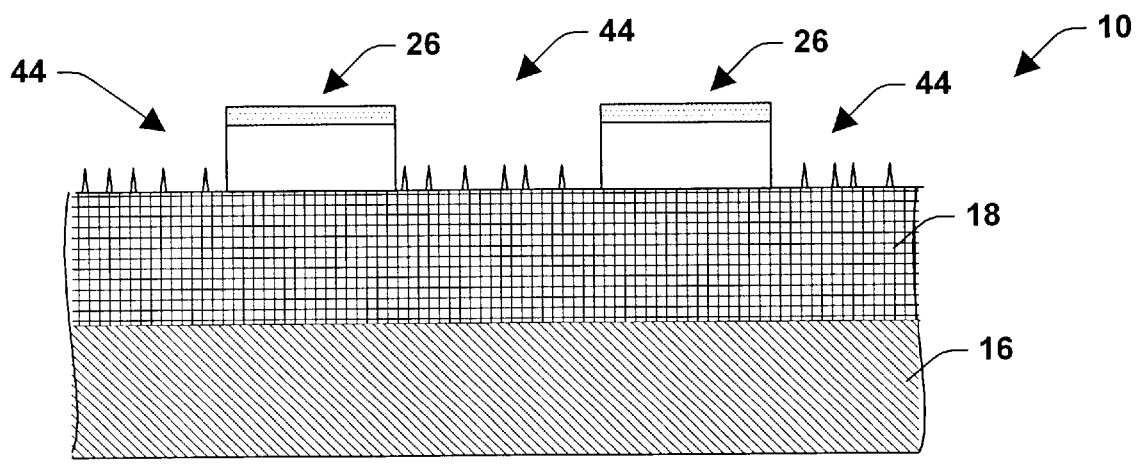
FIG. 1e is a schematic cross-sectional illustration of the structure of FIG. 1d after the $O_2$ RIE step is substantially complete.

The present invention will now be described with reference to the drawings, wherein like reference numerals are used to refer to like elements throughout.

Figure 2:
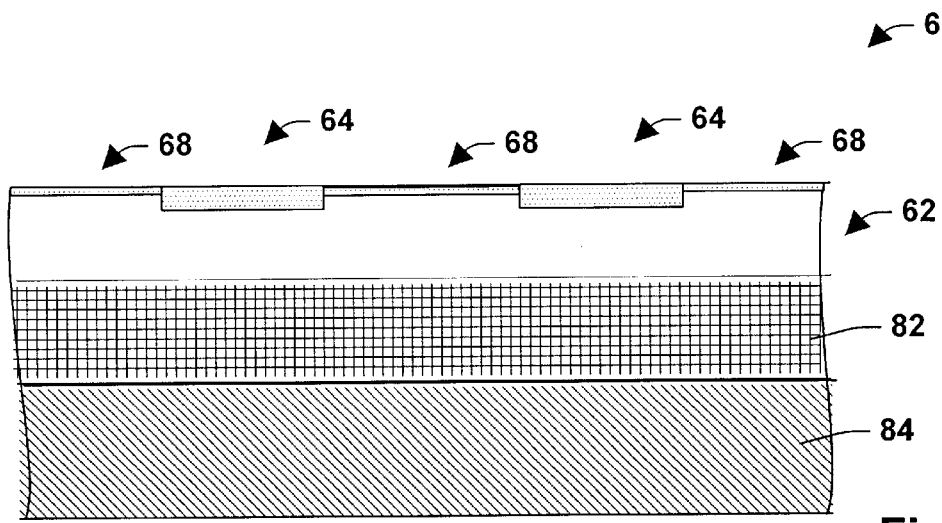
FIG. 2 is a schematic cross-sectional illustration of a structure after a silylation process has been performed thereon in accordance with the present invention.

FIG. 2 schematically illustrates a structure 60 after a silylation process has been performed thereon. The structure 60 includes a patterned photoresist layer 62 having exposed portions 64. The exposed portions 64 have not been developed, but are rendered $O_2$ resistant. As a result of the silylation process, portions of the photoresist layer 62 include trace amounts of silicon 68. These trace amounts of silicon 68 are often the cause of undesirable silicon grass. The structure 60 also includes an under layer 82 (e.g., polysilicon layer, metal layer, silicon nitride layer, or oxide layer), which is to be etched. The under layer 82 lies over a substrate 84.

Figure 3:
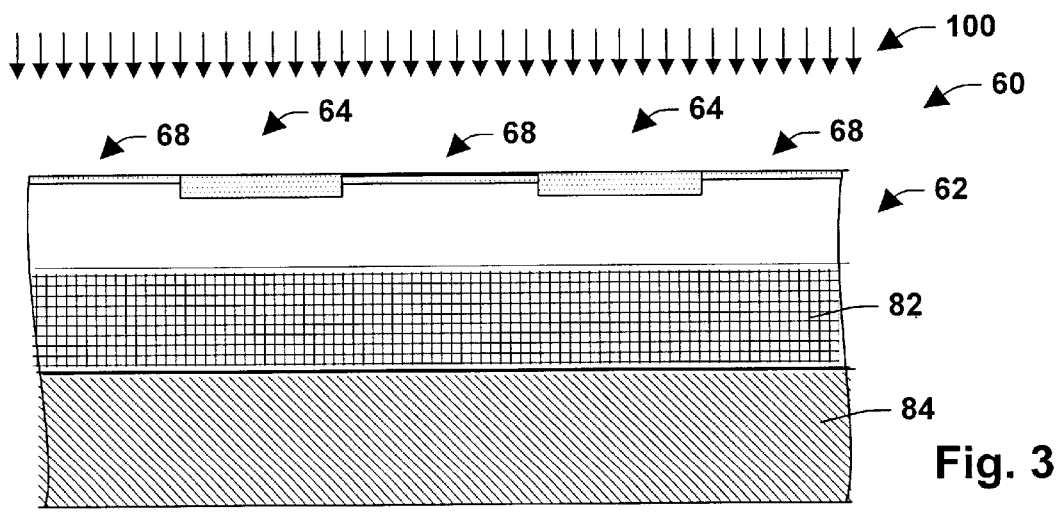
FIG. 3 is a schematic cross-sectional illustration of the structure of FIG. 2 undergoing a chemical mechanical process (CMP) to remove trace amounts of silicon from a photoresist layer in accordance with the present invention.

FIG. 3 schematically illustrates the structure 60 undergoing a chemical mechanical polishing (CMP) step 100 to the trace amounts of silicon 68 from the photoresist layer 62. The CMP process 100 preferably removes about 100 Å–500 Å of the photoresist layer 62, which corresponds to a thickness of the trace amounts of silicon 68. It is to be appreciated that the CMP process 100 described herein may be suitable tailored to remove a desired thickness of the photoresist layer 62 to eliminate the undesired trace amounts of silicon 68.

The CMP process 100 of the present invention provides for controlled removal of desired amounts of the photoresist layer 62 that results in a remaining photoresist layer of accurate thickness and low non-uniformity. To accomplish the CMP process 100, a chemical agent is applied to the structure 60 with the capability to react with the photoresist 62 in the surface/subsurface range. The degree of reaction should not be great enough to cause rapid or measurable dissolution of the photoresist 62, but should modify chemical bonding in the resist surface layer to facilitate surface layer removal by applied mechanical stress. Although numerous chemicals that attack photoresist may be considered, the present invention makes use of the fact that solutions of a strong base (e.g., KOH or $(CH_3)_4NOH$) will react with the photoresist, the rate and extent of reaction depending on the base concentration. A second parameter for successful photoresist CMP is the application of mechanical stress. Photoresist resins are soft materials that easily undergo plastic deformation. Care must be taken in choosing a polishing surface. The polishing pad should be a soft, compressible material of uniform density. Preferably, the polishing pad material is highly porous, both for compressibility and so as to deliver liquid medium to and photoresist by-products away from the structure surface. The polishing pad should exhibit high surface area contact with the structure 60 so that load stresses are uniformly distributed over the polished surface. One example of a preferred polishing pad is a foamed, urethane pad manufactured by Rodel, Inc. designated as Politex Supreme, embossed. It is to be appreciated that any polishing pad suitable for carrying out the present invention may be employed and is intended to fall within the scope of the hereto appended claims.

The use of abrasive particles in the form of a slurry (a typical feature of conventional CMP) is unnecessary when polishing a soft, readily soluble substance such as photoresist. Accordingly, a preferred liquid polishing medium employed in accordance with the present invention comprises an aqueous solution with substantially no abrasive content, and a non-ionic polyethylene oxide type surfactant, Triton X100, at a 200 ppm concentration level. Mechanical stresses are applied directly to the photoresist layer by the polymeric surface of the polishing pad.

Preferred polishing parameters fall within about the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

Experimental results indicate that a downforce of about 2 psi is preferred.

After the CMP process 100 is substantially complete, the surface of the structure 60 is cleaned using suitable techniques.

Figure 4:
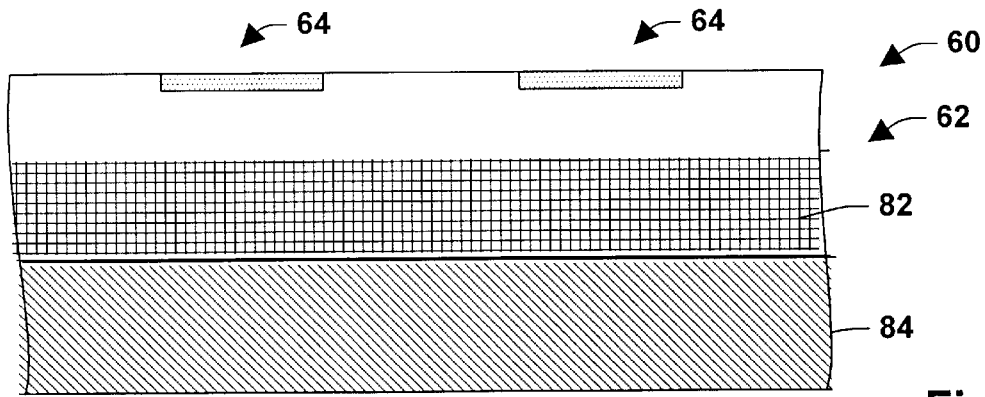
FIG. 4 is a schematic cross-sectional illustration of the structure of FIG. 3 after the CMP is substantially complete in accordance with the present invention.

FIG. 4 illustrates the structure 60 after the CMP process 100 is complete. The CMP process 100 removed portions of the photoresist layer 62 including the trace amounts of silicon 68.

Figure 5:
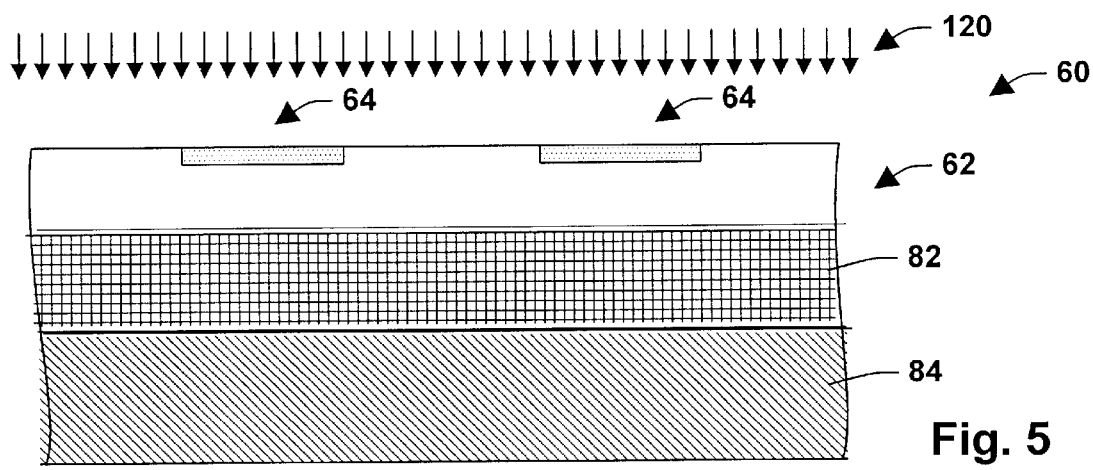
FIG. 5 is a schematic cross-sectional illustration of the structure of FIG. 4 undergoing an $O_2$ RIE to remove portions of a photoresist layer that are not $O_2$ resistant in accordance with the present invention.
Figure 6:
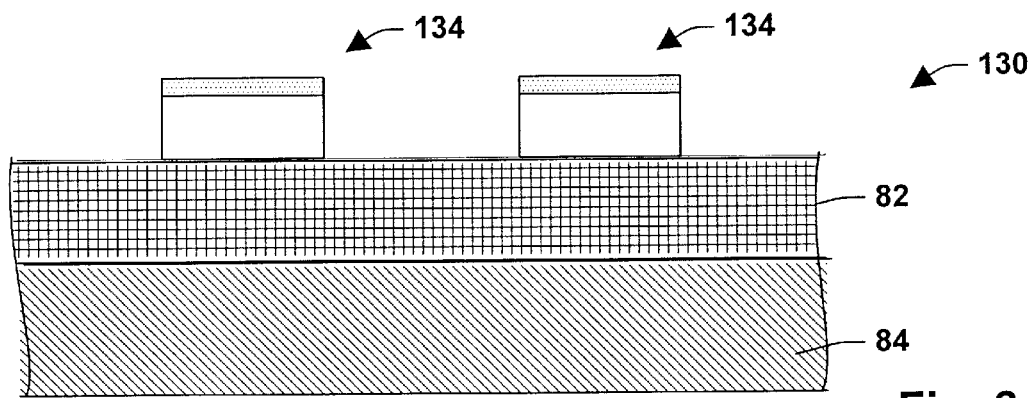
FIG. 6 is a schematic cross-sectional illustration of the structure of FIG. 5 after the $O_2$ RIE is substantially complete in accordance with the present invention.
Figure 7:
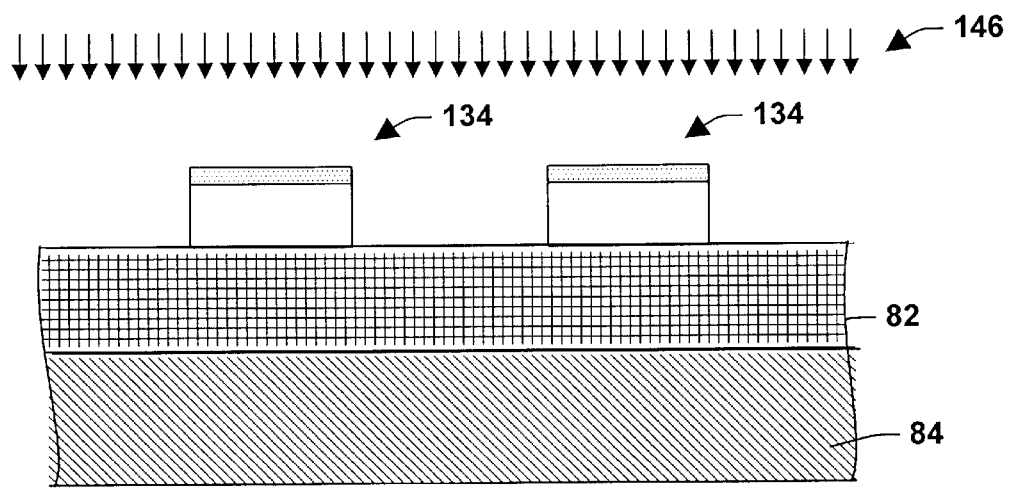
FIG. 7 is a schematic cross-sectional illustration of the structure of FIG. 6 undergoing an etch step to etch an underlayer in accordance with the present invention.
Figure 8:
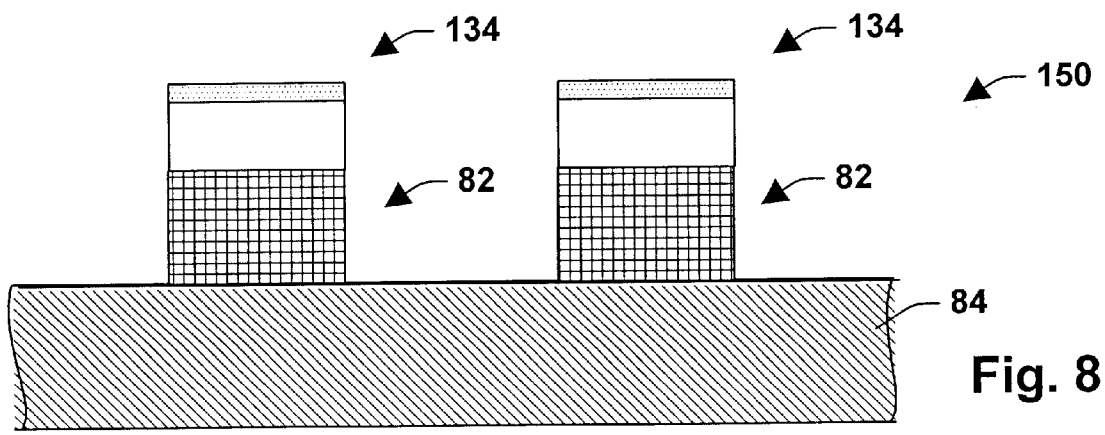
FIG. 8 is a schematic cross-sectional illustration of the structure of FIG. 7 after the underlayer etch step is complete in accordance with the present invention.
Figure 9:
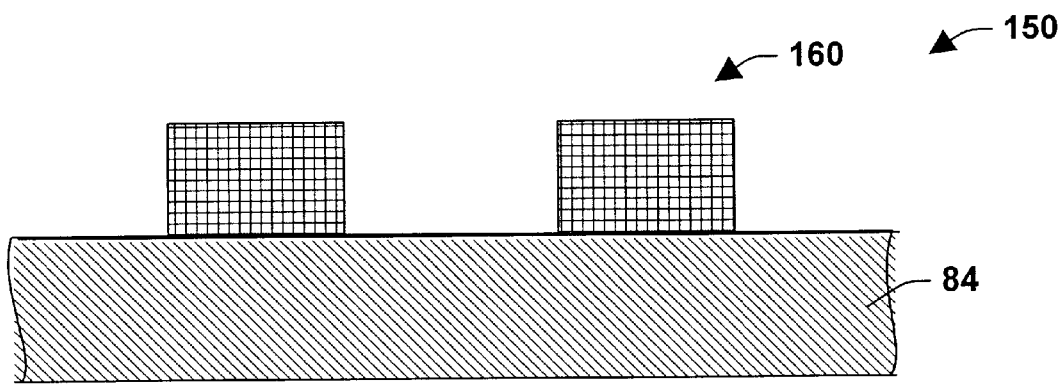
FIG. 9 is a schematic cross-sectional illustration of the structure of FIG. 8 after a stripping process has been performed to remove photoresist layer portions from the etched underlayer in accordance with the present invention.

FIG. 5 illustrates an $O_2$ RIE process 120 being performed on the structure 60 to etch the patterned photoresist layer 62 to result in the structure 130 of FIG. 6. In the structure 130, silicon containing portions of the photoresist layer 62 served as a mask during the $O_2$ RIE 120 such that non-silicon containing portions of the photoresist layer 62 were removed. The remaining portions 134 of the photoresist layer will serve as masks during an underlayer etch step 146 (FIG. 7). The underlayer etch step 146 removes portions of the under layer 82 not masked by the remaining photoresist layer portions 134 to result in the structure 150 of FIG. 8. Thereafter, the photoresist layer portions 134 are stripped to leave a patterned under layer 160 as shown in FIG. 9.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for mitigating formation of silicon grass, comprising:

performing a silylation process on a semiconductor structure, the structure including a photoresist layer, an underlayer under the photoresist layer, and a substrate under the underlayer; and employing a polishing pad in a chemical mechanical polishing process to remove a portion of the photoresist layer, the chemical mechanical polishing process comprising polishing parameters falling within the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

2. The method of claim 1 wherein the chemical mechanical process is performed to remove undesired traces of silicon from particular portions of the photoresist layer.

3. The method of claim 1 further including the step of employing a polishing solution including at least one of KOH and $(CH_3)_4NOH$.

4. The method of claim 3, the polishing solution further including a non-ionic polyethylene oxide type surfactant.

5. The method of claim 1 wherein the polishing pad comprises a polymeric surface.

6. The method of claim 1 further including the step of rotating a polishing pad at a predetermined speed to facilitate removal of a desired amount of the photoresist layer.

7. A method for mitigating formation of silicon grass, comprising:

performing a silylation process on a semiconductor structure, the structure including a photoresist layer, an underlayer under the photoresist layer, and a substrate under the underlayer;

employing a polishing pad in a chemical mechanical polishing process to remove a portion of the photoresist layer, the chemical mechanical polishing process comprising polishing parameters falling within the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec.; | performing a reactive ion etch to remove select portions of the photoresist layer; and performing an underlayer etch to remove select portions of the underlayer.

8. The method of claim 7 wherein the chemical mechanical process is performed to remove undesired traces of silicon from particular portions of the photoresist layer.

9. The method of claim 7 further including the step of employing a polishing solution including at least one of KOH and $(CH_3)_4NOH$.

10. The method of claim 9, the polishing solution further including a non-ionic polyethylene oxide type surfactant.

11. The method of claim 7 wherein the polishing pad comprises a polymeric surface.

12. The method of claim 7 further including the step of rotating a polishing pad at a predetermined speed to facilitate removal of a desired amount of the photoresist layer.

13. A method for mitigating formation of silicon grass, comprising:

performing a silylation process on a semiconductor structure, the structure including a photoresist layer having portions including trace amounts of silicon; and employing a chemical mechanical polishing process to remove the trace amounts of silicon, the chemical mechanical polishing process comprising polishing parameters falling within the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

14. The method of claim 13 further including the step of employing a polishing solution including at least one of KOH and $(CH_3)_4NOH$.

15. The method of claim 13 further including the step of employing a polishing pad with a polymeric surface.

16. The method of claim 13 further including the step of rotating a polishing pad at a predetermined speed to facilitate removal of a desired amount of the photoresist layer.

17. The method of claim 14, the polishing solution further including a non-ionic polyethylene oxide type surfactant.

* * * * *